United States Patent [19]

Kozlowski et al.

[11] Patent Number: 5,747,734

[45] Date of Patent: May 5, 1998

[54] UNIVERSAL MODULAR HOUSING SYSTEM

[75] Inventors: Mark L. Kozlowski, Muncie, Ind.; Ross Whiteaker, New Smyrna Beach, Fla.

[73] Assignee: Siemens Stromberg-Carlson, Boca Raton, Fla.

[21] Appl. No.: 91,500

[22] Filed: Sep. 7, 1993

[51] Int. Cl.[6] .................................................. H01J 5/00
[52] U.S. Cl. ........................ 174/50; 361/695; 174/52.1; 174/37
[58] Field of Search ........................... 174/37, 38, 39, 174/50, 52.1; 361/695, 730, 732, 735, 825, 826; 220/3.92, 3.94, 4.02; 379/327, 328, 329, 330

[56] References Cited

U.S. PATENT DOCUMENTS

| | | | |
|---|---|---|---|
| 1,863,376 | 6/1932 | Kessler et al. | 379/376 |
| 2,028,509 | 1/1936 | Knell | 220/3.94 |
| 2,567,740 | 9/1951 | Smith, Jr. | 361/828 |
| 3,319,202 | 5/1967 | Lockie | 336/61 |
| 3,564,112 | 2/1971 | Eik et al. | 174/52.1 |
| 3,787,711 | 1/1974 | Bright | 361/603 |
| 4,644,095 | 2/1987 | Bright et al. | 174/50 |
| 4,685,385 | 8/1987 | Rich | 454/52 |
| 4,926,009 | 5/1990 | Van Leeuwen | 174/135 |
| 4,931,904 | 6/1990 | Yui | 361/695 |
| 5,023,397 | 6/1991 | Tomes et al. | 174/50 |
| 5,101,321 | 3/1992 | Remise et al. | 361/695 |
| 5,231,247 | 7/1993 | Paul et al. | 174/50 |
| 5,235,133 | 8/1993 | Roth et al. | 174/37 |
| 5,239,129 | 8/1993 | Ehrenfels | 174/51 |
| 5,409,419 | 4/1995 | Euchner et al. | 454/184 |
| 5,540,548 | 7/1996 | Eberhardt et al. | 415/182.1 |

*Primary Examiner*—Kristine L. Kincaid
*Assistant Examiner*—Kamand Cuneo
*Attorney, Agent, or Firm*—Joseph S. Codispoti

[57] ABSTRACT

A field expandable modular housing system includes a plurality of housings having a universal configuration, with each housing including a fan box for securing a predetermined cooling fan, air inlet and exhaust ports, front and back doors, a cable trough mounted near the top of the housing, and side cutouts for permitting electrical cable to run between bolted together ones of the housings, for electrically interconnecting electrical equipment contained within the housing, and universal equipment mounting brackets installed within each housing for securing desired equipment within each housing.

29 Claims, 8 Drawing Sheets

UNIVERSAL MODULAR HOUSING SYSTEM

FIELD OF THE INVENTION

The field of the present invention relates generally to housings for containing electrical and other equipment, and more particularly to methods and apparatus for a system of such housings that permits the storage or capacity to be expanded as required without interruption of existing service.

BACKGROUND OF THE INVENTION

Housings for enclosing and protecting electrical equipment are well known in the art. Many different types of electrical equipment must be retained in appropriate housings to protect the equipment from hostile environments, from rain, snow, insect damage, animal damage, human tampering, and so forth. For example, in the telecommunications industry sensitive electrical equipment must be stored in housings outdoors to protect the equipment from the elements, and from tampering. Initially, a given customer of a telecommunications supplier may only require only a very limited system. However, as the business of the customer grows, the associated telecommunications system must be expanded. When this occurs, it may be difficult for the customer to expand their present telecommunications system, in that the existing housing is limited in the additional equipment that can be stored in the housing. As a result, to be prudent, the customer must attempt at the time of initially purchasing a telecommunications system, for example, to predict future expanded service requirements at the time of installation. In this manner, the user typically has a larger than required housing installed in order to accommodate the anticipated future requirements. This places an additional burden on the customer, in that capital must be allocated at the time of initial installation of the system to cover requirements that are not yet necessary. Also, as technology changes, it may occur that existing housings specifically designed for a particular technology or system, must be replaced with new housings specifically designed to house the new technology.

The present inventors recognize that there is a need in the field of the present technology for an electrical equipment housing design that is universal, and easily expanded. Also, it is recognized that such expandable housings should have an interior configuration readily adaptable to be modified for accepting virtually an unlimited array of different equipment configurations, as required by advances in the associated technology. The housing must be expandable without the loss or interruption of existing service.

SUMMARY OF THE INVENTION

With the problems of the prior art in mind, one object of the invention is to provide a universal modular housing system for housing electrical equipment, that is capable of being easily expanded by connecting additional modules into the system, whereby the modules or housings are secured together and existing service is not interrupted.

Another object of the invention is to provide an electrical equipment housing system that is modularized for easy expansion, wherein each of the modules is capable of housing a plurality of different configurations of electrical equipment, the modules being selectively secured together for permitting required expansion of the housing system, the modules including means permitting electrical cables to be passed between the modules, and means for substantially preventing any exterior water from penetrating to the interior of the modules.

With these and other objects in mind, the present invention includes a common modular housing design for containing electrical equipment protected from the environment and tampering. Multiple ones of the housings have similar configurations but may differ in height. Each housing includes cutouts in the right and left sides thereof for permitting electrical cables to be passed between interconnected modules to cable troughs located in the upper portions of each module, whereby the cables may then be routed to equipment contained within the housing module below the cable troughs. In one embodiment, the housings are bolted together with gasket seals therebetween to provide a water seal between the bolt holes, and the cutouts for cable routing. Also, bracket means are used for further securing adjacent housings together, in a manner providing both more rigid securement therebetween, and also preventing water from penetrating from the tops of the housings to the space between the housings. In use, when a given housing is not connected on a left or right side to another modular housing, an access panel is secured over the associated cutout or cable entry hole for closing off the same. Access doors are provided at the front and back portions of the modular housings. In one embodiment, EIA standard equipment mounts, are mounted within the interior of each of the modular housings for accommodating telecommunications equipment, and other such equipment applicable for use within EIA standard brackets. Also, a fan box is included within each modular housing configuration for receiving a frontmost portion a fan bracket configured for receiving a predetermined fan for circulating cooling air through the modular housing. The removable fan bracket permits a user to select from amongst a range of different fans, depending upon the cooling requirements. The fan box also includes interconnecting duct work for providing air flow paths for directing air from the fan, and through a damper, whereafter the air is exhausted from an air exhaust duct at the top portion of the front of the modular housing. Input ports may be located at the bottom portion of the front of the housing, or in some other portion of the housing, for providing appropriate circulation of air through the housing module to the fan, and out of the exhaust port. The air intake port is fitted with a filter, for preventing airborne contaminates from entering into the modular housing. In one embodiment the cable trough is bolted to the back of the fan box, with the fan box being bolted or fastened to the inside surface of the top of the modular housing. The modular housings stand on fiberglass or concrete pads, whereby the pads are configured for permitting additional pads to be easily connected together for accommodating additional modular housings as required. In another embodiment, the modular housings may be mounted on poles whereby tie straps are used to connect the top portions of the modules to the poles, and a steel channel member bolted between the poles serves as a base for supporting the bottom of the interconnected modular housings. New equipment is easily installed, connected, and placed in service without causing loss of service to existing equipment.

BRIEF DESCRIPTION OF THE DRAWINGS

A detailed description of the various embodiments of the invention is given below with reference to the accompanying drawings, in which like items are identified by the same reference designation, in which.

DETAILED DESCRIPTION OF THE INVENTION

The present invention in its various embodiments is described in detail in the following paragraphs. For purposes of illustration, the description is partly directed towards use of the present modular housing system for providing outdoor enclosures for telecommunications equipment. As will be shown, the present modular housing system provides for environmentally controlling and protecting telecommunications equipment, for example, and other equipment. However, the present modular housing configuration is not meant to be limited to enclosing telecommunications equipment. It can also be used for enclosing a variety of other equipment by incorporating appropriate mounting hardware within the housing. As will be shown, the present housing system is designed to be selectively expanded by a user on an as-required basis without loss of existing service. The present modular housing system eliminates the costly prior requirement that equipment housing users either through prediction of future requirements incorporate an initially oversized housing at the time of initial installation of a system, thereby including room for expected future requirements, or alternatively accepting the increased cost of having to extensively modify initial housings and/or add additional housings with cable conduits and costly customized design. As described below the modular housings of the present system are universal in design, and provide ultimate flexibility to a user as to both the arrangement and mounting of equipment within a given housing, and also to expansion of the housing system.

Figure 1:
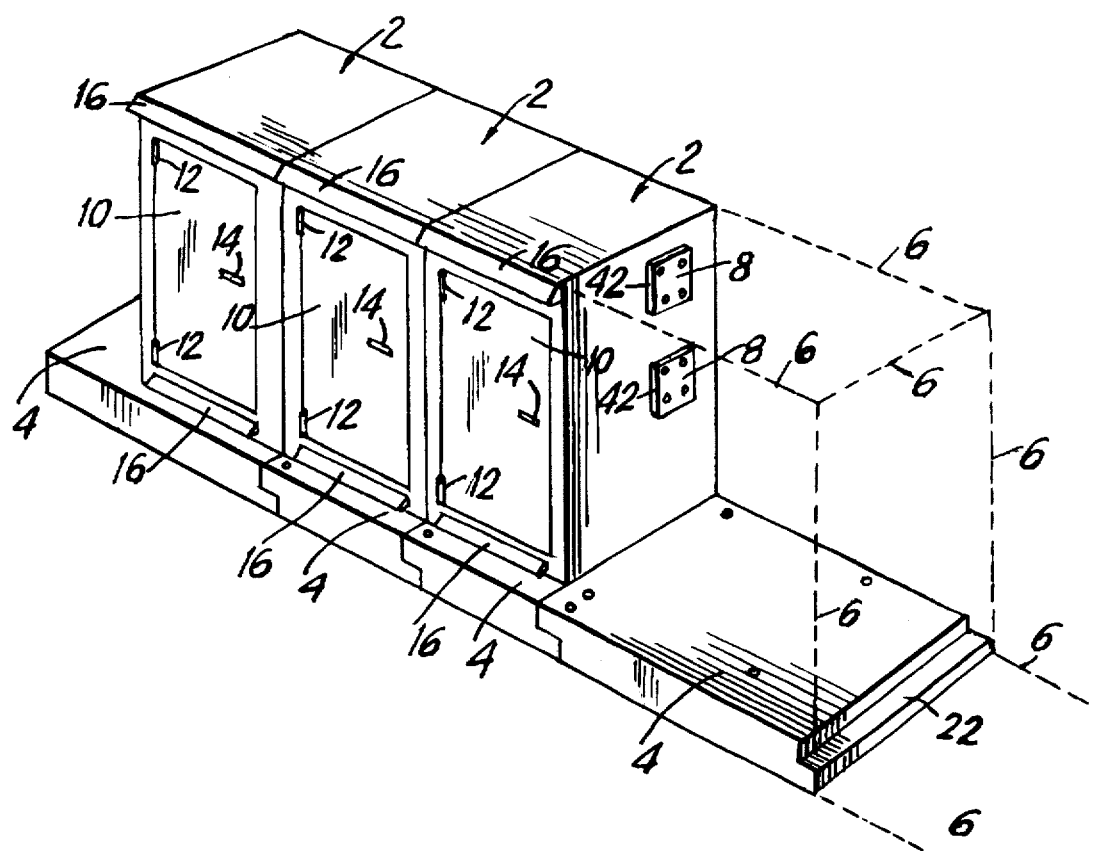
FIG. 1 is a pictorial illustration of one embodiment of the invention showing a plurality of modular housings secured together on a pedestal preparatory to further expansion of the modular housing system.

In FIG. 1, three substantially identical modular housings 2, respectively, are connected together on individual mounting pads 4, in this example. The mounting pads 4 are designed to be rigidly secured together, as shown, for providing a unitary mounting pad for the entire modular housing system. The dash or phantom lines 6 are meant to illustrate the expansion capability of the present modular housing system. Access panels or cover plates 8 are shown bolted in place on an end located modular housing 2, for covering cutouts permitting electrical cables or conduits, for example, to be routed between interconnected ones of the modular housings 2, as required in given applications. Front doors 10, mounted on hinges 12, seal off front openings of the modular housings 2, respectively. Do or handles 14 are provided on each of the doors 10, as shown, in this example. Each of the modular housings 2, in this example, include rain shields 16, as shown, for substantially preventing rain from entering air exhaust ports 18, and air intake ports 20 (see FIG. 4), in this example.

Figure 2:
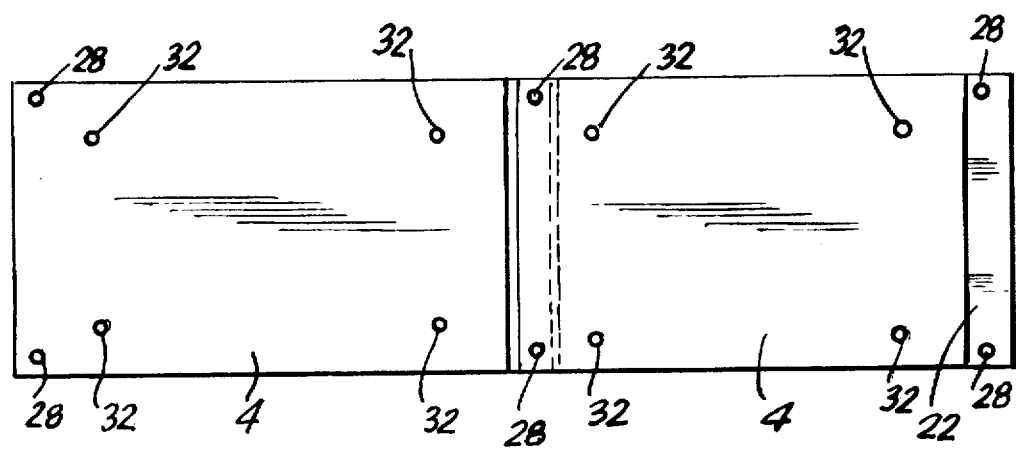
FIG. 2 is a top view of mounting pads of one embodiment of the invention.
Figure 3:
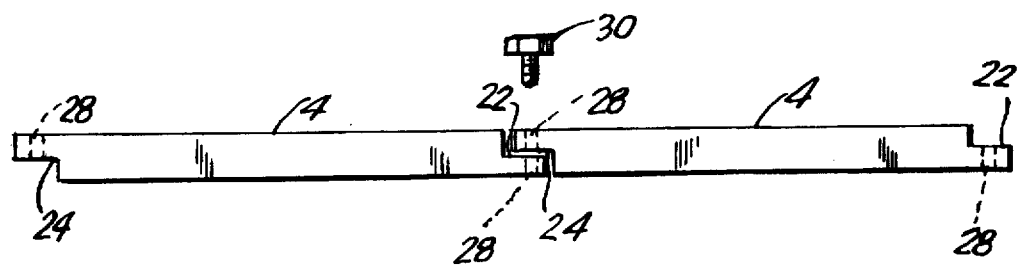
FIG. 3 is a front elevation view of the mounting pads of FIG. 2.

With reference to FIGS. 1, 2, and 3, the mounting pads 4 include at opposite ends a stepped down edge or lip portion 22, and a stepped up edge or lip portion 24, respectively. These lip portions 22 and 24 provide for the mounting pads 4 to interconnect in overlapping manner as shown in FIG. 3, along respective side edges. Bolt holes 28 are provided at each corner of the pads 4, respectively, for receiving self-threading bolts 30, for example, for securing the juxtaposed mounting pads 4 together. Also, mounting holes 32 are included on the pads 4, for receiving self-threading bolts (not shown), for example, from the bottoms of the associated modular housings 2, for securing the latter to respective mounting pads 4. Note that threaded inserts that can be used in the holes 32 and/or in the holes 28, as an alternative to using self-threading bolts.

Figure 4:
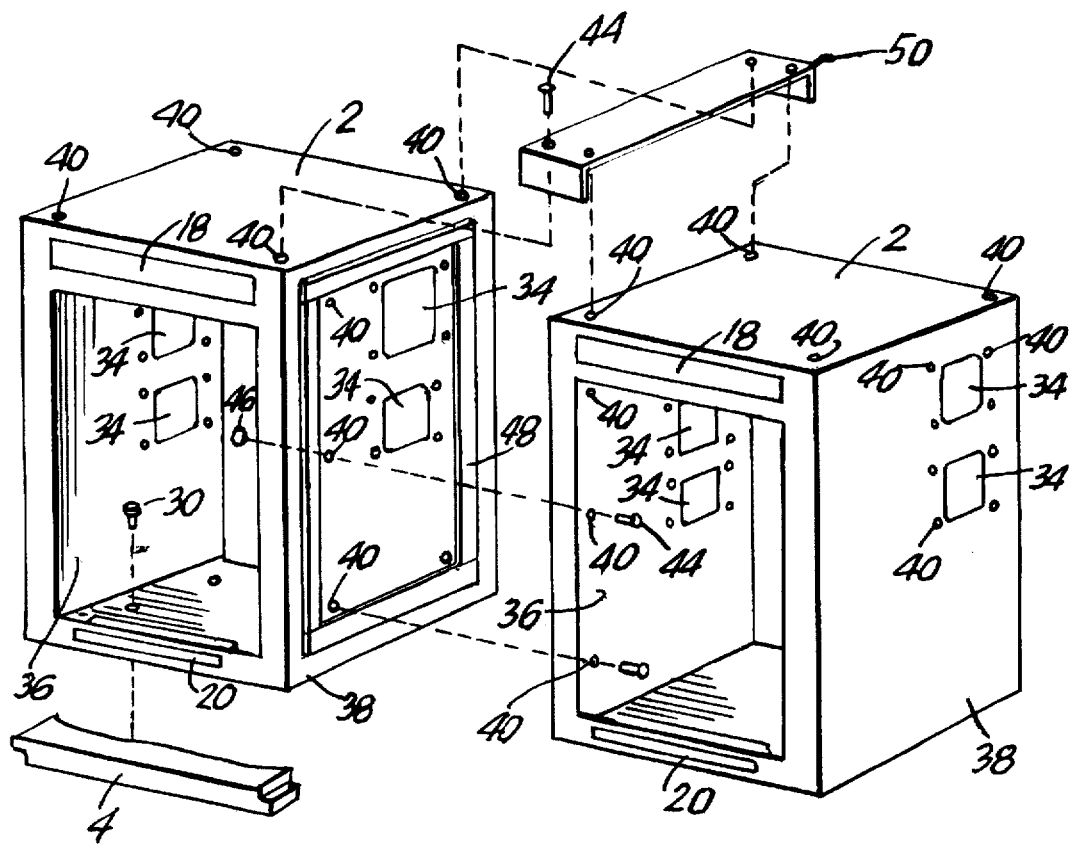
FIG. 4 shows a simplified exploded assembly diagram of two modular housings of one embodiment of the invention preparatory to connecting the housings together, whereby the housing are of the same height.

In FIG. 4, a simplified exploded assembly diagram is shown for interconnecting or securing together two modular housings 2 of the same height, in this example. The housings 2 include one or more cutout portions 34 at predetermined locations through the left sides 36, and right sides 38 of the modular housings 2, respectively. The cutouts 34 permit electrical cables (not shown), conduits, and so forth, to be routed between interconnected ones of the housings 2 and connected without service interruption. Depending upon the application, and relative heights of the interconnected housings, the number and positioning of the cutouts 34 on the left and right sides 36 and 38, respectively, of each of the housings 2 may vary. When these cutouts 34 are not required for use, cover plates 8 are secured over the cutouts 34 via bolt holes 40, in this example. Gasket seals 42 (see FIG. 1) are used to insure a watertight seal between the cover plates 8 and cutouts 34.

Figure 6:
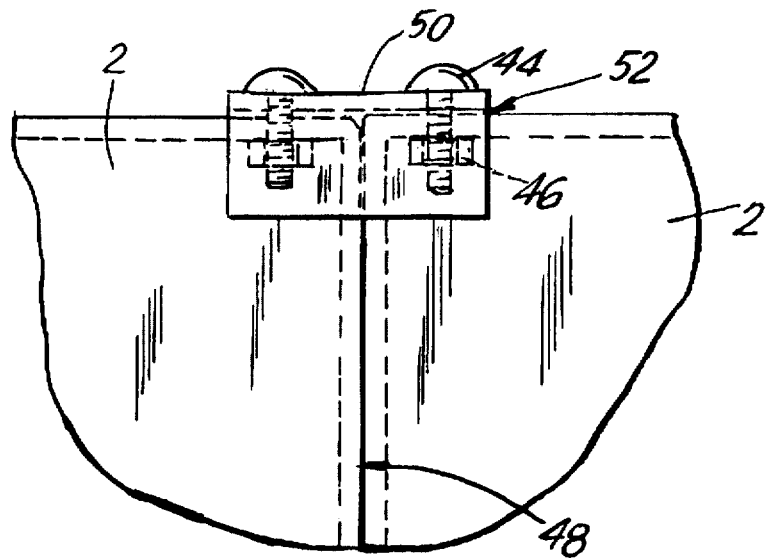
FIG. 6 is a detailed view of a coupling feature joining the modular housings of FIG. 4 together, in one embodiment in the invention.

The housings 2 are first positioned over their respective mounting pads 4, and bolted thereto via bolts 30, as previously described. The juxtaposed sides of the adjacent housings 2 are bolted together by inserting bolts 44 from the inside surface of one adjacent side through bolt holes 40 thereof, and through associated bolt holes 40 on the opposing side of the other housing 2, to be secured via nuts 46, in this example. Other types of fastening means may be used in securing the cabinets or housings 2 together, as would be known to one of skill in the art. It is important to minimize the entry of moisture into the housings 2. Accordingly, a gasket seal 48 is applied as shown on one side of a housing 2 to be secured to an opposing side of another housing 2. In this example, the gasket 48 is applied to the right side 38 of one of the housing 2, as shown, enclosing the area including the cutouts 34 and bolt holes 40. The gasket seal 48 consists of any appropriate material for providing a substantially watertight seal between the joined housings 2 area, and if necessary an EMI seal. To both more rigidly secure the two housings 2 together, and to substantially avoid moisture running down from the tops of the housings 2 into the space therebetween, a truncated U-shaped bracket 50 is bolted between the housings 2, as shown. In FIG. 6, a detailed view of a portion of the front elevation about bracket 50, as secured between the housings 2, is shown. The bracket 50 is secured to the housings 2 via bolts 44 and nuts 46 between the top surfaces of the housings 2, and the bottom inside surface of the top of the housings 2, respectively. Also, an appropriate watertight seal, such as an adhesive material 52 (silicone seal RTV, for example) is applied particularly about the bolt holes 40 and bolts 44, and on the undersurface of the bracket 50, as shown, before installation of bracket 50 for providing a moisture barrier.

Figure 5:
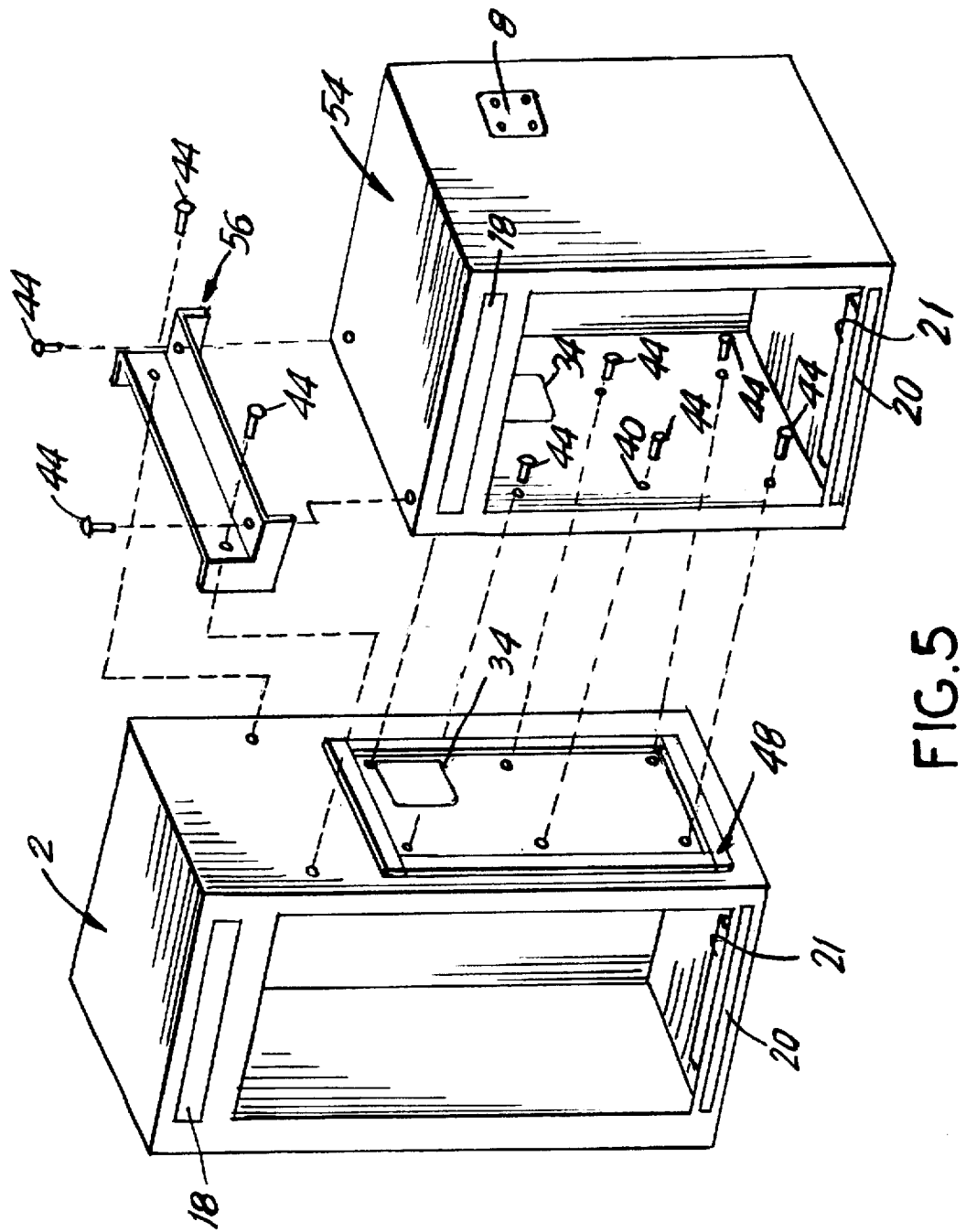
FIG. 5 shows a simplified exploded assembly diagram of two modular housings of another embodiment of the invention, preparatory to connecting the two housings together, whereby each is of a different eight.
Figure 7:
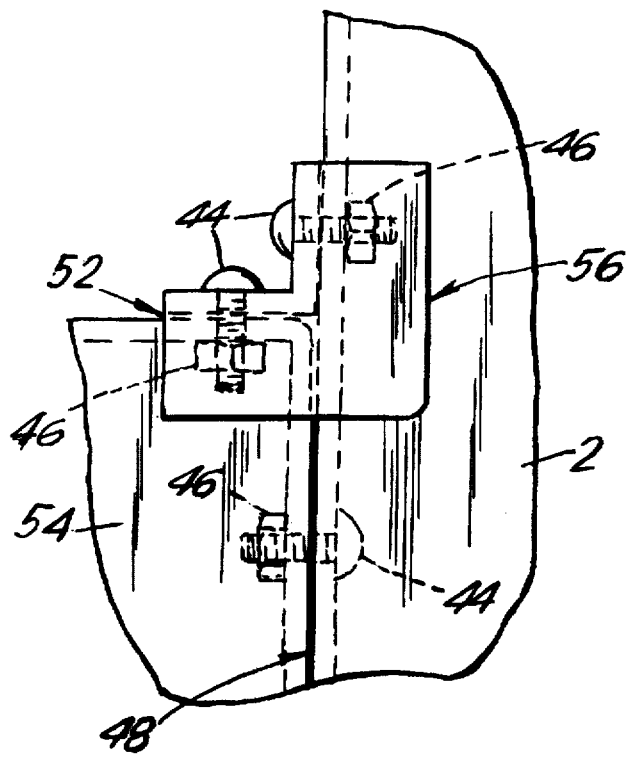
FIG. 7 is a detailed view of a coupling feature of one embodiment in the invention for joining together two modular housings of different height, as in FIG. 5.

In certain applications, it may be necessary to provide a modular housing system having housings of different heights. In another embodiment of the invention, shown in FIG. 5, modular housing 2 is secured to a shorter modular housing 54, as shown. The housings 2 and 54 are bolted together as shown, incorporating a gasket seal 48, as previously described for the embodiment of FIG. 4. In this example, an L-shaped bracket 56 is bolted through use of bolts 44 and nuts 46 between the housings 2 and 54, as shown, for providing more rigid coupling therebetween, and also substantially preventing moisture from running from the tops of the housings 2 and 54 to the space therebetween. A detailed view of the securement of the housing 2 to the housing 54 about bracket 56, is shown in FIG. 7. As in the previous embodiment, a gasket seal 48 is used between the housings 2 and 54, as previously mentioned. An appropriate adhesive water sealant material, such as silicone seal 52, is applied between the inside surface of the bracket 56 and the surfaces it contacts of the housings 54 and 2, as shown, for providing a further moisture barrier therebetween, and sealing the spaces between the bolt holes 40, and the bolts 44.

Figure 9:
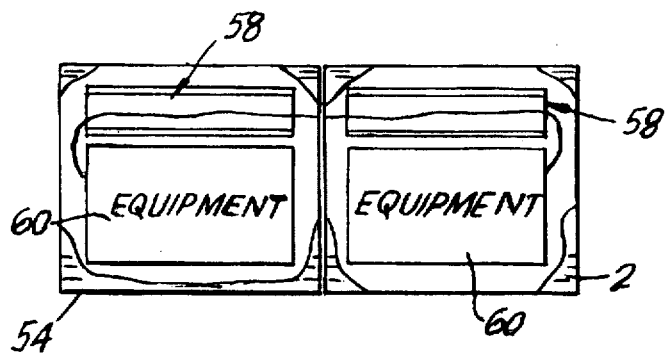
FIG. 9 is a partial cutaway top view of the embodiment in the invention of FIG. 8.
Figure 8:
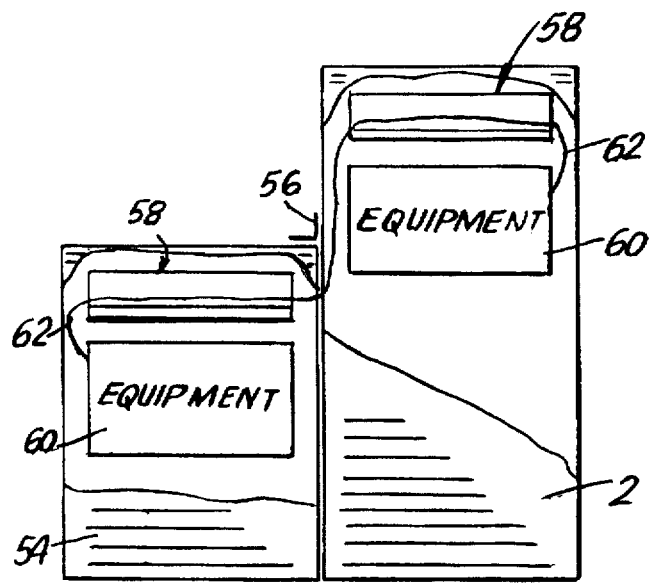
FIG. 8 is a partial cutaway front elevational view showing two modular housings of a different height connected together in one embodiment of the invention.
Figure 10:
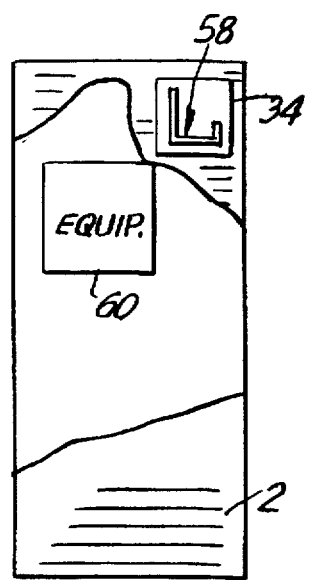
FIG. 10 is a right-side elevation view of the embodiment of the invention of FIG. 8.

In FIG. 8, a partial cutaway and front elevational view of two interconnected modular housings 2 and 54 is shown. Individual cable troughs 58 are mounted in the top portions of each one of the housings 2 and 54 respectively. In FIG. 9, a top view is shown of the interconnected modular housings 2 and 54. Note that in this example, the cable troughs 58 are located proximate the back doorways 70 (see FIG. 12) of housings 2 and 54, respectively. Equipment 60, such as telecommunications equipment, for example, requiring electrical interconnections via electrical cables and power busses 62, are mounted below the cable troughs 58 in the housings 2 and 54, in this example. Electrical cable 62 is passed from the equipment 60 in housing 2, through the associated cable trough 58, to the opposing cutouts or cable holes 34 of housings 2 and 54, respectively, through the cable trough 58 of housing 54, to equipment 60 within housing 54, as shown in this example. As shown in the partial cutaway side elevational view of housing 2 in FIG. 10, cable trough 58 is mounted to be proximate at least one cutout 34. Another cutout 34 is located on the opposite side of housing 2 proximate the other end of the cable trough 58. The same configuration between cable trough 58 and cutouts 34 in the sides of housing 54 is provided. As previously indicated, the taller housing 2 includes additional cutouts 34, located at a height in the sides of the housing 2 compatible with the height of cutouts 34 in the shorter housings 54, for permitting easy passage of electrical cable 62 between interconnected ones of the housings 2 and 54. If housings 2 are secured to like housings, or housings 54 to like housings, the cutouts 34 thereof will be in direct opposition to one another.

Figure 11:
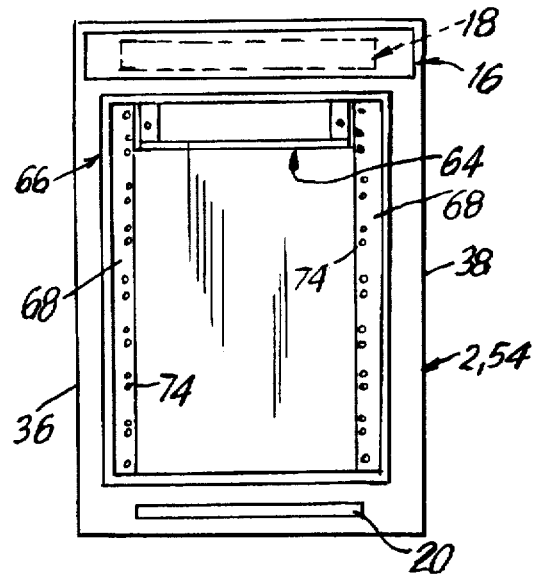
FIG. 11 is a front elevation view of a modular housing of one embodiment of the invention.

In FIG. 11, a modular housing 2 or 54 is shown in a front elevation view with the door 10 removed. A fan box 64 is shown mounted in the upper portion of the interior of housing 2. The rain shield 16, as previously described is shown in place, with the protected air exhaust port 18 shown in phantom. Also, looking through the front doorway 66, EIA standard equipment mounts or brackets 68 are shown, in this example, for accommodating telecommunications equipment. However, for accommodating other types of equipment within housings 2 or 54 other types of brackets may be used.

Figure 12:
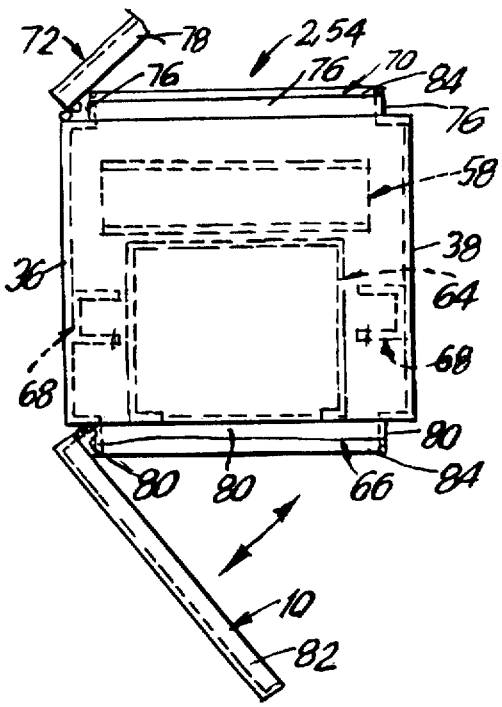
FIG. 12 is a top view of a modular housing configuration of one embodiment of the invention.

In FIG. 12, a top view of the modular housings 2 or 54 of FIG. 11 is shown. The mounting brackets 68 for equipment to be contained within the housings 2 or 54, in this example, are rigidly mounted to the inside surface of the left and right sides 36, 38, respectively, of housings 2 or 54 in a vertical orientation. In this example, mounting brackets 68 include a plurality of holes 74 for securing equipment 60 thereto via appropriate bolts and nuts (not shown), for example. Note that the back doorway 70 includes slightly protruding top, bottom, and side edges 76, which are enclosed within a recessed portion of 78 of back door 72, when back door 72 is closed. Similarly, the front doorway 66 includes protruding top, bottom, and side edges 80 which are enclosed within a recess 82 of front door 10 when closed. This feature assists in providing adequate gasket seals 84 about the front lips of the protruding side edges 76 and 80 for substantially preventing moisture from entering into the housing 2 when doors 10 and 72 are closed. Note also that rain water will tend to flow around the top protruding edges 76 and 80, and run down the associated sides of housings 2 or 54 to the ground.

Figure 13:
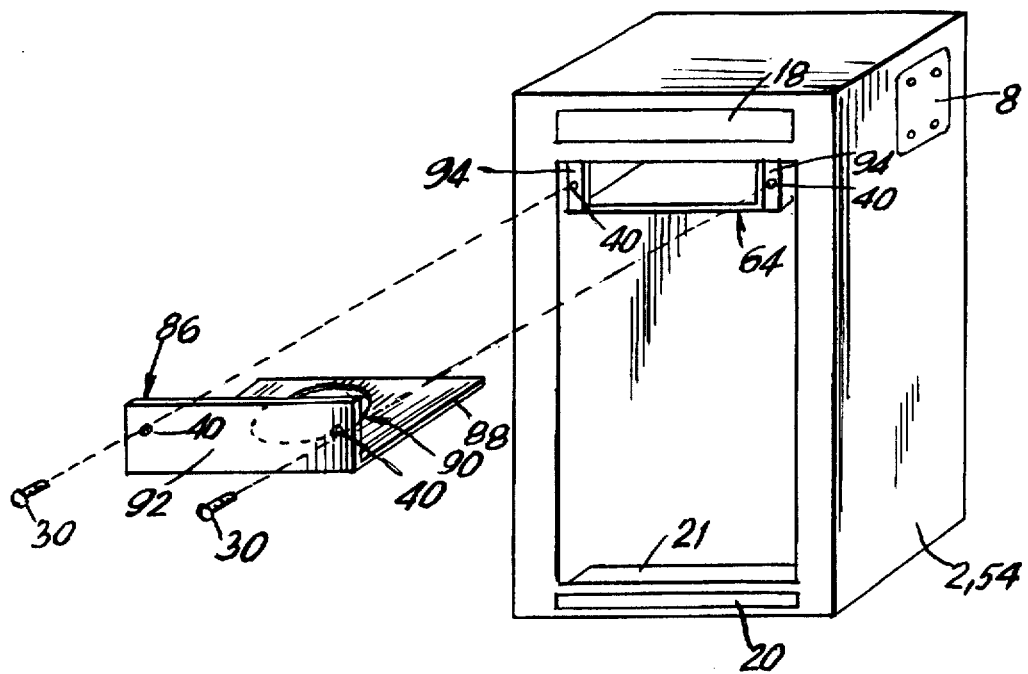
FIG. 13 is a simplified pictorial diagram showing a partial exploded assembly diagram of a fan bracket and fan box feature of one embodiment of the invention.

Either of the housings 2 or 54, in this example, may include a fan box 64, if it is required that a fan be included within a housing 2 or 54, for circulating air through the associated housing to cool electrical equipment operating therein. As shown in FIG. 13, a lower portion of fan box 64 is configured for receiving a fan bracket 86 that is L-shaped, and includes a bottom portion 88 with a centrally located fan cutout 90. The cutout 90 is configured for receiving a predetermined size and type of fan for mounting within the housing 2 or 54. Fan bracket 86 also includes a front lip 92 with bolt holes 40. Associated bolt holes 40 are included in the side mounting flanges 94 on either side of fan box 64, as shown, for receiving the front lip 92 of fan bracket 86. Self tapping bolts or screws 30, in this example, are used to secure the fan bracket 86 to fan box 64.

Figure 14:
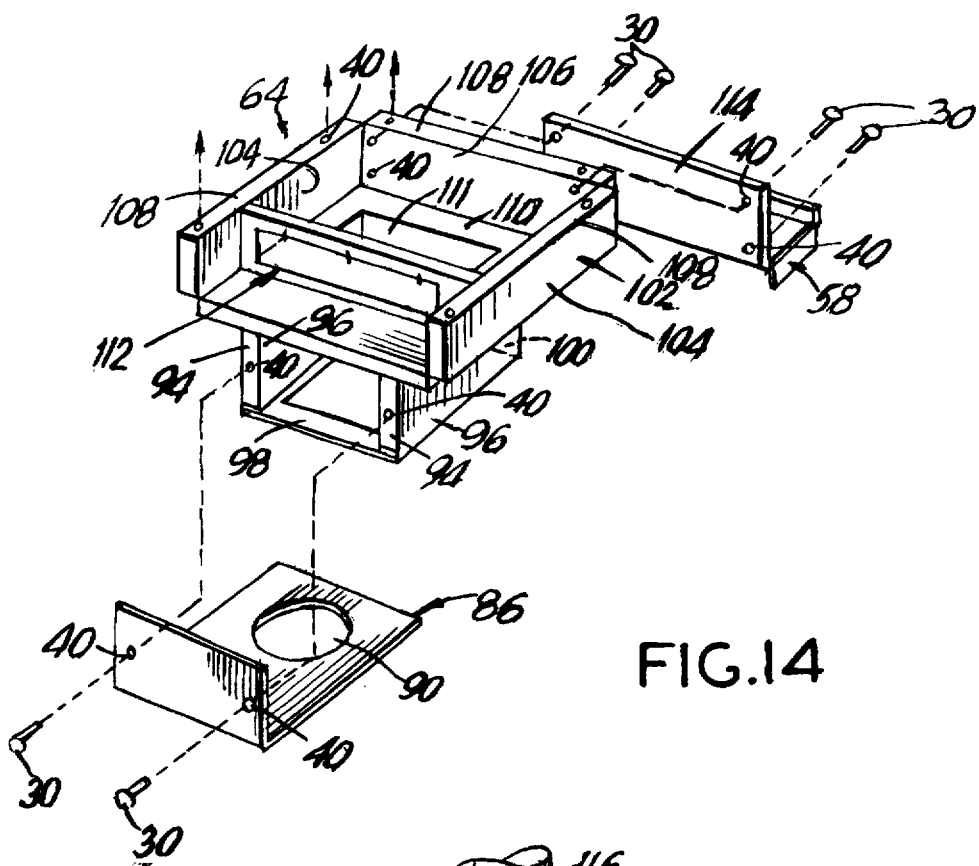
FIG. 14 is a simplified exploded assembly diagram showing the interconnection between a fan box, cable trough, and fan bracket, for one embodiment of the invention.

In FIG. 14, a detailed view is shown of the fan box assembly 64, in combination with an exploded assembly view showing the attachment of fan bracket 86, and cable trough 58 to the fan box assembly 64. As shown, the fan box 64 includes a lower box-like section having opposing side members 96, front mounting flanges 94, a cutout bottom portion 98, and a closed back 100 (shown in phantom only). The top portion of fan box 64 includes an expanded box-like portion 102 having an open front, opposing sides 104 and a closed back side 106. Mounting flanges 108 are formed about the top edges of the opposing sides 104 and back side 108. Bolt holes 40 are provided in the mounting flanges 108, for permitting the fan box 64 to be bolted to the inside surface of the top of the associated housing 2 or 54. The bottom 110 of the expanded upper portion 102 of fan box 64 includes a centrally located cutout portion 111 for permitting exhaust air to flow from a fan mounted on fan bracket 86 to flow upward and be exhausted through a damper 112 mounted between the opposing sides 104 of the expanded upper portion 102. Also in this example, the backside 106 includes bolt holes 40 for receiving self-threading bolts 30 for attaching a cable trough 58 to the back of the fan box 64, as shown. Note that to accommodate this, the cable trough 58 includes bolt holes 40 through its back wall portion 114. Alternatively, cable trough 58 can be provided with a top-mounting flange for bolting it directly to the inside surface of the top of the associated housing 2 or 54. The fan box 64 is required in applications where it is necessary to include a cooling fan within the associated housing 2, 54, as previously mentioned. However, for purposes of providing a universal housing 2 or 54, fan box 64 may be provided with a blank fan bracket 86, whereby the fan bracket 86 can readily be removed for securing a fan thereto and reinstalled.

Figure 15:
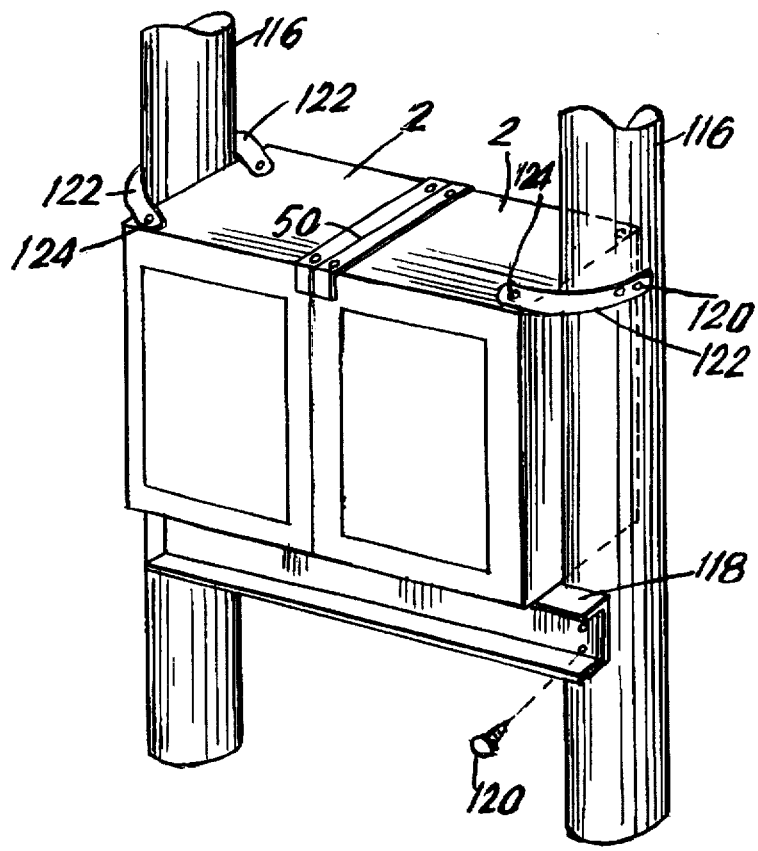
FIG. 15 s a pictorial diagram showing an embodiment of the invention for mounting modular housings thereof between vertically oriented poles.

Certain applications may require that equipment housings be mounted in an elevated position. In this regard, FIG. 15 shows two housings 2 mounted between two telephone poles 116. In this example, an appropriate steel or aluminum channel cross member 118 that is bolted between poles 116 via lag bolts 120, in this example. Tie straps 122 are bolted between the telephone poles 116 and the tops of the housings 2, as shown. Lag bolts 120 secure one end of each of the tie straps 122 to the telephone poles 116, respectively, and carriage bolts 124 are used to bolt the other ends of the straps 122 to the tops of the associated housing 2, in this example.

Although various embodiments of the invention have been shown and illustrated herein, they are not meant to be limiting. Those with skill in the art may recognize various modifications to these embodiments. It is intended that any such modifications be covered by the spirit and scope of the claims appended hereto.

What is claimed is:

1. A field expandable modular housing system for housing equipment, the modular housing system comprising:

a plurality of modular housings each having a top, bottom, right side, left side, front and back, said front and back each including substantially large openings for permitting easy access to the interior of said each of said housings;

mounting bracket means included in each of said housings rigidly attached to inside surfaces of the right and left sides, for providing supports to which equipment can be secured at selected locations;

fan box means secured to the inside surface of the top of each of said housings, for receiving a predetermined electrical fan for circulating cooling air through said each of said housings;

a cable trough secured between said fan box means and said back opening of each of said housings, and oriented with its longitudinal axis aligned with the width of said each of said housings;

an air exhaust port cut through an uppermost portion of the front of each of said housings;

said fan box means including an air exhaust duct coupled to said air exhaust port of said each of said housings;

an air intake port cut through a lowermost portion of the front of each of said housings for permitting outside air to be drawn into said each of said housings, circulated therethrough, and exhausted from said exhaust port;

hinged front and back doors mounted upon the front and back of each of said housings for selectively closing off or exposing the front and back openings of said each of said housings;

cable access holes cut through the left and right sides of said housings, at least proximate respective ends of said cable trough;

bolt holes through the sides of each of said housings for permitting said housing to be selectively bolted together for expanding said housing system, whereby said cable access holes of juxtaposed ones of said housings are opposing one another, for permitting electrical cables to pass therebetween from said cable trough of said juxtaposed ones of said housings, for interconnecting electrical apparatus within said housings; and cover plate means secured to the sides of said housings, for covering or sealing off exposed ones of said cable access holes of at least end positioned ones of said housings of the housing system.

2. The modular housing system of claim 1, wherein said fan box means further includes a removable fan bracket attachable to a lower portion of said fan box means, said fan bracket including a bottom portion with a cutout configured to permit said fan to be rigidly secured thereto.

3. The modular housing system of claim 1, wherein said fan box means further includes a damper secured across said air exhaust duct, for opening via the pressure of exhaust air from said fan to permit air to flow therefrom out of said exhaust port, and for closing to seal said exhaust duct whenever said fan is inoperative.

4. The modular housing system of claim 2, wherein said fan box means further includes a damper secured across said air exhaust duct, for opening via the pressure of exhaust air from said fan to permit air to flow therefrom out of said exhaust port, and for closing to seal off said exhaust duct whenever said fan is inoperative.

5. The modular housing system of claim 1, wherein said cable trough is secured to an upper back wall portion of said fan box means.

6. The modular housing system of claim 4, wherein said cable trough is secured to an upper back wall portion of said fan box means.

7. The modular housing system of claim 6, wherein said fan box means further includes:

a lowermost box-like air intake duct having a substantially open bottom, closed opposing sides, a closed back, open front portion with mounting flanges projecting from each side edge, and a top portion opening into said exhaust duct of said fan box means;

said air exhaust duct having a bottom portion opening into said air intake duct, closed opposing sides, a closed back and an open front, said damper being secured between said opposing sides near the open front, and mounting flanges projecting perpendicularly from top edges of the closed opposing sides and closed back for permitting said fan box means to be bolted to the top of said each of said housings, and said closed backs being said upper back wall portion to which said cable trough is secured.

8. The modular housing system of claim 1, further including a filter secured within each of said housings about said air intake port, for filtering air entering said each of said housings through the air intake port.

9. The modular housing system of claim 1, further including rain shield means on each of said housings rigidly attached about side and top edges of each of said air exhaust port, and air intake port, for substantially preventing rain from entering these ports, respectively.

10. The modular housing system of claim 1, further including:

gasket seal means between successive ones of said plurality of housings bolted together, for preventing water from entering said housings through said bolt holes or said cable access holes.

11. The modular housing system of claim 1, further including:

housing bracket means bolted between successive ones of said plurality of housings bolted together, for both more rigidly securing said housings together and for substantially preventing water from running from upper portions of said each of said housings to space between the housings.

12. The modular housing system of claim 11, further including:

said housing bracket means consisting of an elongated U-shaped bracket slightly longer than the widths of each adjacent juxtaposed ones of said housings, for fitting snugly between portions of the top of each adjacent juxtaposed ones of said housings, said bracket including bolt holes for permitting it to be bolted to the tops of each of said adjacent housings, when said housings are of equal height.

13. The modular housing system of claim 11, further including:

said housing bracket means consisting of an elongated L-shaped bracket of substantially the same width as the widths of each associated pair of said housings of different height, said brackets including bolt holes for bolting one leg of said bracket to a top edge portion of the shorter one of the abutted associated pair of housings, and for bolting the other leg to a side portion of the taller housing proximate the shorter housing.

14. The modular housing system of claim 11, further including gasket means for providing a watertight seal between said housing bracket means and said each of said housings.

15. The modular housing system of claim 1, wherein said mounting bracket means consists of Equipment Industries Association standard equipment mounts for facilitating the installation of telecommunications equipment in each of said housings.

16. The modular elongated housing system of claim 1, whenever said cable troughs are L-shaped members with a raised front lip.

17. The modular housing system of claim 1, further including expandable mounting pad means, for providing a flat mounting surface between the bottom of each one of said housings and the ground.

18. The modular housing system of claim 17, wherein said mounting pad means include stepped down and stepped up opposing side edge portions, for permitting juxtaposed ones of said pads to be secured together in an overlapping manner at their edges, for expanding said system.

19. A housing for a field expandable modular housing system for equipment including electrical apparatus, mechanical apparatus, and electromechanical apparatus, said housing comprising:

a top, bottom, right side, left side, front and back, said front and back each including substantially large openings for permitting easy access to the interior of said housing;

mounting bracket means rigidly attached to inside surfaces of the associated right and left sides, for providing supports to which equipment can be secured at selected locations;

fan box means secured to the inside surface of the top, for receiving a predetermined electrical fan for circulating cooling air through said housing;

a cable trough secured between said fan box means and said back opening, and oriented with its longitudinal axis aligned with the width of the housing;

an air exhaust port cut through an uppermost portion of a front doorway;

said fan box means including an air exhaust duct coupled to said air exhaust port of the housing;

an air intake port, cut through a lowermost portion of said front doorway, permitting outside air to be drawn into the housing, circulated therethrough, and exhausted from said air exhaust port;

hinge mounted front and back doors mounted upon the front and back of said housing for selectively closing off or exposing one or both of the front and the back openings of the housing;

cable access holes cut through the left and right sides, at least proximate respective ends of said cable trough;

bolt holes through the sides of the housing for permitting said housing to be selectively bolted together to like housings, whereby said cable access holes of juxtaposed ones of said housings are opposing one another for permitting electrical cables and power busses to pass therebetween from said cable troughs of said juxtaposed ones of said housings, for interconnecting electrical apparatus within connected ones of said like housings without interruption of existing service; and cover plates means secured to the sides of said housing for covering or sealing off exposed ones of said cable access holes.

20. The housing of claim 19, wherein said fan box means further includes a removable fan bracket attachable to a lower portion of said fan box means, said fan bracket including a bottom portion with a cutout configured to permit said fan to be rigidly secured thereto.

21. The housing of claim 19, wherein said fan box means further includes a damper secured across said air exhaust duct, for opening via the pressure of exhaust air from said fan to permit air to flow therefrom out of said exhaust port, and for closing to seal off said exhaust duct whenever said fan is inoperative.

22. The housing of claim 20, wherein said fan box means further includes a damper secured across said air exhaust duct, for opening via the pressure of exhaust air from said fan to permit air to flow therefrom out of said exhaust port, and for closing to seal off said exhaust duct whenever said fan is inoperative.

23. The housing of claim 22, wherein said fan box means further includes:

a lowermost box-like air intake duct having a substantially open bottom, closed opposing sides, a closed back, open front portion with mounting flanges projecting from each side edge, and a top portion opening into said exhaust duct portion of said fan box means;

said air exhaust duct portion having a bottom portion opening into said air intake duct, closed opposing sides, a closed back, and an open front said damper being secured between said opposing sides near the open front, and mounting flanges projecting perpendicularly from edges of the side and back portions for permitting said fan box means to be bolted to the top of said housing, and said closed back being said upper back wall portion to which said cable trough is secured.

24. The housing of claim 19, further including a filter secured about said intake port, for filtering air entering said housing through the air intake port.

25. The housing of claim 19, further including rain shield means rigidly attached about side and top edges of each of said air exhaust port, and air intake port, respectively, for substantially preventing rain from entering these ports.

26. The housing of claim 19 further including:
gasket seal means attached to a side of said housing to be secured to a side of a like ones of said housing, for preventing water from entering said housing through said bolt holes or said cable access holes.

27. The housing of claim 19, wherein said mounting bracket means consists of Equipment Industries Association standard equipment mounts for facilitating the installation of telecommunications equipment in said housings.

28. The housing of claim 19, wherein said cable trough is elongated and L-shaped with a raised front lip.

29. A field expandable modular housing system, comprising:
a first modular housing having a top, bottom, right side, left side, front and back, said front and back each including substantially large openings for permitting access to the interior of said first modular housing, further including:
front and back hinge mounted doors upon said front and back portions of said housing, respectively for selectively closing off or permitting access to the front and back openings, respectively;
first and second latching means connected between said front and back hinge mounted doors, respectively, and said housing respectively, for permitting said first and second doors to each be selectively secured to said housing to close off said front and back openings, respectively, or to be opened to expose said front and back openings, respectively;
a cable trough mounted in said housing proximate both said back opening and said top, said cable trough being narrower than the interior width of said housing, said cable trough thereby including first and second ends spaced away from said right and left sides of said housing, respectively, for permitting cables and power busses to be passed therebetween to equipment mounted below said cable trough within said housing;
first and second cutouts cut through said right and left sides of said housing proximate said first and second ends of said cable trough, for permitting cables to pass between said first modular housing and other said first modular housings;
first and second access panels adapted for removable attachment to said housing for covering said first and second cutouts, respectively, when not in use;
mounting bracket means attached to the inside walls of said right and left sides of said housing, for receiving and mounting equipment in said housing below said cable trough;

an air exhaust port provided by a third cutout through an upper portion of the front of said housing above both said front opening, and a top edge of said front door when closed;

a backdraft damper mounted proximate said air exhaust port, permitting air to flow only out of said exhaust port into the ambient air surrounding said housing;

an air intake port provided by a fourth cutout through a lower portion of the front of said housing below both said front opening, and a bottom edge of said front door when closed;

a filter mounted within said housing behind said air intake port;

a rain shield mounted along a top edge at the front of said housing, for shielding and preventing rain from entering said exhaust port;

a fan box means mounted below said backdraft damper;

a removable fan bracket rigidly mounted upon said fan box means, said fan bracket including a hole or cutout sized for accommodating the mounting thereto of a predetermined size of fan;

first and second removable cover plates mounted over said first and second cutouts, respectively;

a plurality of bolt holes arranged in a substantially rectangular pattern through each of said right and left sides, respectively, for receiving a plurality of bolts, respectively, at all times;

a first mounting pad laid on the ground for receiving the bottom of said first modular housing;

a second modular housing substantially identical in design configuration to said first modular housing, but having one of equal height, taller height, or shorted height than said first modular housing;

gasket means enclosing said bolt holes and the associated one of said first and second cutouts on the right or left side of said first modular housing, to be secured to a left or right side respectively of said second modular housing, respectively, for providing a watertight seal therebetween;

a second mounting pad laid on the ground, and secured via interlocking side edge configurations to said first mounting pad, respectively, for receiving the bottom of said second modular housing;

means for securing the bottoms of said first and second modular housings to said first and second mounting pads, respectively;

first bolt means for securing adjacent ones of the right and left sides of said first and second modular housings tightly together via respective bolt holes; and bracket means for both further rigidly securing said first and second modular housings together, and for including means for preventing moisture from running from a top portion of the interface therebetween into areas therebetween.

* * * * *